(12) United States Patent
Kenney (10) Patent No.: US 8,857,128 B2
(45) Date of Patent: Oct. 14, 2014

(54) REINFORCED DEVICE HOUSING

(75) Inventor: Kevin M. Kenney, San Jose, CA (US)

(73) Assignee: Apple Inc., Cupertino, CA (US)

( * ) Notice: Subject to any disclaimer, the term of this patent is extended or adjusted under 35 U.S.C. 154(b) by 495 days.

(21) Appl. No.: 12/467,998

(22) Filed: May 18, 2009

(65) Prior Publication Data

US 2010/0289390 A1 Nov. 18, 2010

(51) Int. Cl.
  *E06B 1/04* (2006.01)
  *H04M 1/18* (2006.01)
  *B29C 70/86* (2006.01)
  *H05K 5/00* (2006.01)
  *B29C 70/46* (2006.01)
  *B29C 70/34* (2006.01)
  *B29C 43/00* (2006.01)
  *B29K 105/24* (2006.01)
  *H04M 1/02* (2006.01)
  *B29K 707/04* (2006.01)

(52) U.S. Cl.
  CPC ............... *H05K 5/00* (2013.01); *H04M 1/185* (2013.01); *B29C 70/865* (2013.01); *B29K 2105/246* (2013.01); *H04M 1/0249* (2013.01); *B29K 2707/04* (2013.01); *B29C 70/465* (2013.01); *B29C 70/345* (2013.01); *B29C 43/006* (2013.01)
  USPC ................. 52/656.1; 52/3; 52/202; 52/222; 52/662

(58) Field of Classification Search
  CPC   B29C 70/086; B32B 27/12; B32B 2260/046; B32B 5/26; B32B 7/12
  USPC ............. 52/3–5, 202, 204, 222, 656.1, 656.2, 52/662
  See application file for complete search history.

(56) References Cited

U.S. PATENT DOCUMENTS

| 1,775,813 A | 9/1930 | Colby |
| 1,957,156 A | 5/1934 | Barth et al. |

(Continued)

FOREIGN PATENT DOCUMENTS

| DE | 10123400 | 2/2002 |
| EP | 1139638 | 10/2001 |

(Continued)

OTHER PUBLICATIONS

International Search Report, PCT/US2010/033215, 4 pages, Aug. 5, 2010.

(Continued)

*Primary Examiner* — William Gilbert
*Assistant Examiner* — Alp Akbasli
(74) *Attorney, Agent, or Firm* — Brownstein Hyatt Farber Schreck, LLP (57) ABSTRACT

A housing for an electronic device or other object formed from a fiber-in-matrix material. A layered fiber-in-matrix type material, such as CFRP, may be used. A spine made from CFRP may support, and be attached to, a CFRP skin. The CFRP spine may be a unitary frame that imparts strength and rigidity to the overall housing and also form at least some of the corners of the frame. In some embodiments, the spine may be rectangular. The skin may be formed from multiple layers of CFRP type material stacked atop each other. Each layer may be cut at one or more corners to expose at least a portion of the layer beneath. The skin may thus have an overall cross shape, such that each arm of the cross may be wrapped around a different side of the aforementioned rectangular spine.

6 Claims, 10 Drawing Sheets

(56) References Cited

U.S. PATENT DOCUMENTS

| | | | |
|---|---|---|---|
| 2,050,901 A | 8/1936 | Sundell | |
| 2,638,523 A | 5/1953 | Rubin | |
| 2,834,158 A | 5/1958 | Petermann | |
| 2,990,616 A | 7/1961 | Kuris et al. | |
| 3,131,515 A | 5/1964 | Mason | |
| 3,535,955 A | 10/1970 | Stanley et al. | |
| 3,802,040 A | 4/1974 | Nomamoto | |
| 3,814,016 A * | 6/1974 | Leach et al. | 102/303 |
| 3,957,715 A | 5/1976 | Lirones et al. | |
| 4,343,846 A | 8/1982 | Kohn | |
| 4,439,298 A * | 3/1984 | Ford et al. | 204/258 |
| 4,467,168 A | 8/1984 | Morgan et al. | |
| 4,622,091 A | 11/1986 | Letterman | |
| 4,934,103 A | 6/1990 | Campergue et al. | |
| 4,988,550 A * | 1/1991 | Keyser et al. | 428/41.1 |
| 5,052,153 A | 10/1991 | Wiand | |
| 5,064,707 A | 11/1991 | Weaver et al. | |
| 5,101,599 A | 4/1992 | Takabayasi et al. | |
| 5,111,579 A * | 5/1992 | Andersen | 29/897.32 |
| 5,116,138 A * | 5/1992 | Macsenti et al. | 383/33 |
| 5,140,773 A | 8/1992 | Miwa et al. | |
| 5,237,788 A * | 8/1993 | Sandow | 52/200 |
| 5,249,534 A * | 10/1993 | Sacks | 109/24 |
| 5,264,992 A | 11/1993 | Hogdahl et al. | |
| 5,395,682 A * | 3/1995 | Holland et al. | 442/240 |
| 5,439,330 A | 8/1995 | Bayer et al. | |
| 5,503,506 A | 4/1996 | Yuan | |
| 5,619,889 A | 4/1997 | Jones et al. | |
| 5,755,539 A | 5/1998 | Takeuchi et al. | |
| 5,865,569 A | 2/1999 | Holstein et al. | |
| 5,967,357 A * | 10/1999 | Kellogg et al. | 220/9.2 |
| 5,984,600 A | 11/1999 | Gierth | |
| 6,117,517 A | 9/2000 | Diaz et al. | |
| 6,174,392 B1 | 1/2001 | Reis | |
| 6,179,943 B1 | 1/2001 | Welch et al. | |
| 6,193,089 B1 | 2/2001 | Yu | |
| 6,267,036 B1 | 7/2001 | Lani | |
| 6,276,100 B1 * | 8/2001 | Woll et al. | 52/204.62 |
| 6,299,246 B1 | 10/2001 | Tomka | |
| 6,435,363 B2 * | 8/2002 | Fingerhut et al. | 220/1.5 |
| 6,437,238 B1 | 8/2002 | Annerino et al. | |
| 6,775,908 B2 | 8/2004 | Chara et al. | |
| 6,846,221 B2 | 1/2005 | Ulrich et al. | |
| 6,973,815 B2 | 12/2005 | Bryans et al. | |
| 7,097,371 B2 | 8/2006 | Hasunuma et al. | |
| 7,115,323 B2 * | 10/2006 | Westre et al. | 428/593 |
| 7,191,555 B2 * | 3/2007 | Hughes | 40/603 |
| 7,238,089 B2 | 7/2007 | Tsumuraya et al. | |
| 7,326,012 B2 | 2/2008 | Schlotter | |
| 7,338,235 B2 | 3/2008 | Weghaus et al. | |
| 7,354,350 B2 | 4/2008 | Glimpel | |
| 7,393,577 B2 | 7/2008 | Day et al. | |
| 7,436,653 B2 | 10/2008 | Yang et al. | |
| 7,527,321 B1 * | 5/2009 | Benderoth et al. | 296/146.6 |
| 7,545,628 B2 | 6/2009 | Takuma | |
| 7,560,152 B2 * | 7/2009 | Rajabali et al. | 428/57 |
| 7,571,828 B2 * | 8/2009 | Palley et al. | 220/1.5 |
| 7,628,879 B2 * | 12/2009 | Ackerman | 156/98 |
| 7,762,028 B2 * | 7/2010 | Valentz et al. | 52/204.5 |
| 7,790,637 B2 | 9/2010 | DiFonzo et al. | |
| 7,963,483 B2 * | 6/2011 | Roming et al. | 244/133 |
| 7,971,400 B2 * | 7/2011 | Boldt et al. | 52/204.1 |
| 7,988,532 B2 | 8/2011 | Choo et al. | |
| 8,031,186 B2 | 10/2011 | Ostergaard | |
| 8,042,770 B2 * | 10/2011 | Martin et al. | 244/133 |
| 8,096,859 B2 | 1/2012 | Schimweg | |
| 8,252,133 B2 | 8/2012 | Feng et al. | |
| 8,419,883 B2 | 4/2013 | Day et al. | |
| 2001/0017336 A1 * | 8/2001 | Hirahara et al. | 244/123 |
| 2003/0078070 A1 | 4/2003 | Hsu | |
| 2003/0173460 A1 * | 9/2003 | Chapman, Jr. | 244/123 |
| 2004/0085492 A1 * | 5/2004 | Saitoh | 349/65 |
| 2005/0097717 A1 | 5/2005 | Rasmussen | |
| 2005/0142369 A1 * | 6/2005 | Canady et al. | 428/503 |
| 2006/0278875 A1 * | 12/2006 | Ohnuma et al. | 257/66 |
| 2007/0134466 A1 | 6/2007 | Rajaram et al. | |
| 2008/0090477 A1 * | 4/2008 | Balthes et al. | 442/136 |
| 2008/0094372 A1 | 4/2008 | Philipp | |
| 2008/0169380 A1 * | 7/2008 | Jackson et al. | 244/129.3 |
| 2008/0179461 A1 * | 7/2008 | Roming et al. | 244/129.6 |
| 2008/0259537 A1 | 10/2008 | Arisaka et al. | |
| 2009/0001217 A1 * | 1/2009 | Dufresne et al. | 244/119 |
| 2009/0040703 A1 | 2/2009 | Gotham et al. | |
| 2009/0041984 A1 | 2/2009 | Mayers et al. | |
| 2009/0095523 A1 | 4/2009 | Stevenson et al. | |
| 2009/0142157 A1 | 6/2009 | Wang et al. | |
| 2009/0176067 A1 * | 7/2009 | Palley et al. | 428/192 |
| 2009/0267266 A1 | 10/2009 | Lee et al. | |
| 2010/0078254 A1 * | 4/2010 | Rolfe et al. | 180/302 |
| 2010/0233424 A1 * | 9/2010 | Dan-Jumbo et al. | 428/113 |
| 2011/0050509 A1 | 3/2011 | Ayala Vazquez et al. | |
| 2011/0180557 A1 | 7/2011 | Kenney | |
| 2011/0183580 A1 | 7/2011 | Kenney | |
| 2011/0210476 A1 | 9/2011 | Difonzo | |
| 2011/0290685 A1 | 12/2011 | Kenney | |
| 2012/0003454 A1 | 1/2012 | Younes | |
| 2012/0021196 A1 | 1/2012 | Kenney | |
| 2012/0147592 A1 | 6/2012 | Takase | |
| 2012/0222985 A1 | 9/2012 | Kenney et al. | |
| 2013/0148288 A1 | 6/2013 | Kenney | |
| 2013/0273295 A1 | 10/2013 | Kenney et al. | |

FOREIGN PATENT DOCUMENTS

| | | |
|---|---|---|
| EP | 2047983 | 4/2009 |
| EP | 2051572 | 4/2009 |
| JP | 2006123475 | 5/2006 |
| JP | 2007076202 | 3/2007 |
| JP | 2007186228 | 7/2007 |
| JP | 2010115732 | 5/2010 |
| WO | WO98/15404 | 4/1998 |
| WO | WO2008/133748 | 11/2008 |
| WO | WO2009/017571 | 5/2009 |

OTHER PUBLICATIONS

Author Unknown, "3M Microspheres Innovative Solutions for Demanding Applications," 3M Innovations, 6 pages, 2004.

* cited by examiner

REINFORCED DEVICE HOUSING

BACKGROUND

1. Technical Field

Embodiments disclosed herein relate generally to housings for electronics, and more specifically to a housing formed from a carbon fiber reinforced plastic.

2. Background

Many electronic devices, including portable devices, have housings made of plastic. Plastic enclosures tend to be relatively inexpensive and simple to manufacture but may be brittle and crack under relatively low stress. Other electronic devices have metal housings. Metal casings are durable but may be heavier and/or more expensive to manufacture than an equivalently-sized plastic casing.

Some electronic devices use a reinforced plastic housing. For example, certain devices may have a housing formed from carbon fiber reinforced plastic (CFRP). A standard CFRP may be made of multiple layers, each of which typically has carbon fibers aligned in a plastic matrix such that the fibers all extend in substantially the same direction within that layer. The carbon fibers impart structural strength and resistance to bending and breaking against force applied transversely to the length of the fibers. CFRP materials generally have a high strength to weight ratio and weight to stiffness ratio. However, CFRP may crack or break if bent or rolled such that the carbon fibers bend along their lengthwise axis. More commonly, the fibers in each layer of CFRP generally resist conforming to abrupt angles (such as those formed at a corner having right angles) assuming and/or maintaining shapes with compound curves, and bridging It is more accurate to say the fibers will resist conforming to sharp corners and shapes with compound curves, producing bridging between adjacent layers, voids, and other cosmetic and structural defects. Thus, CFRP may not be a material of choice for many applications, especially those having fairly sharp corners such as electronics housings.

SUMMARY

Generally, embodiments described herein take the form of a housing for an electronic device. The housing may be made from a layered CFRP material or other fiber-in-matrix type material. In a sample embodiment, a spine or frame made from CFRP may support, and be attached to, a CFRP skin.

The embodiment may house electronics or virtually anything else. By virtue of the similar materials used to form the frame and skin, the two components may robustly bond to one another and have similar, if not identical, coefficients of thermal expansion. The combination of the robust bond and similar thermal expansion coefficient may permit the embodiment to resist cracking that could plague other housings.

Generally, the skin is formed from multiple layers of CFRP stacked atop one another. The carbon fibers in each adjacent layer generally run in different directions. This may permit the skin to bend in multiple directions without forming cracks that extend through all layers of the skin, since certain layers may crack while others bend.

By tapering certain segments of the frame and forming a stair-step pattern in adjacent section of the skin, mechanical stresses may be spread over the tapered segments instead of being transmitted from the skin to a single, edge abutment between the two components. Since the stresses are spread across a larger area and not concentrated in a plane defining a joinder between the frame and skin, the skin may be less likely to separate from the frame under stress.

DETAILED DESCRIPTION

Generally, embodiments described herein take the form of a housing for an electronic device. The housing may be made from a layered fiber-in-matrix type material, such as CFRP. In a sample embodiment, a spine made from CFRP may support, and be attached to, a CFRP skin.

The CFRP spine may be a unitary frame that imparts strength and rigidity to the overall housing and also form at least some of the corners of the frame. In some embodiments, the spine may be rectangular. The skin may be formed from multiple layers of CFRP type material stacked atop each other. Each layer may be cut at one or more corners to expose at least a portion of the layer beneath it in certain embodiments. The skin may thus have an overall cross shape, such that each arm of the cross may be wrapped around a different side of the aforementioned rectangular spine.

Figure 1:
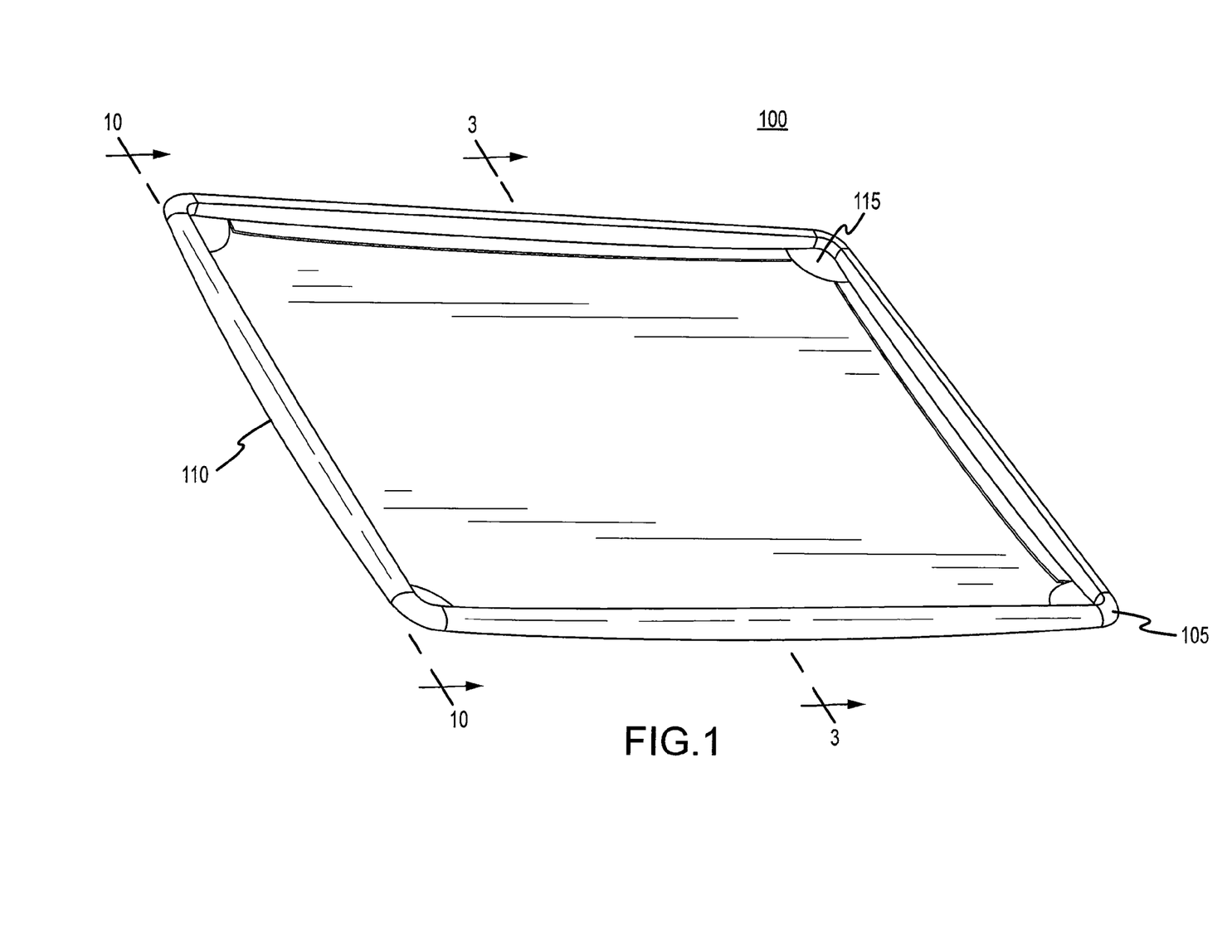
FIG. 1 depicts a top perspective view of a sample embodiment.
Figure 2:
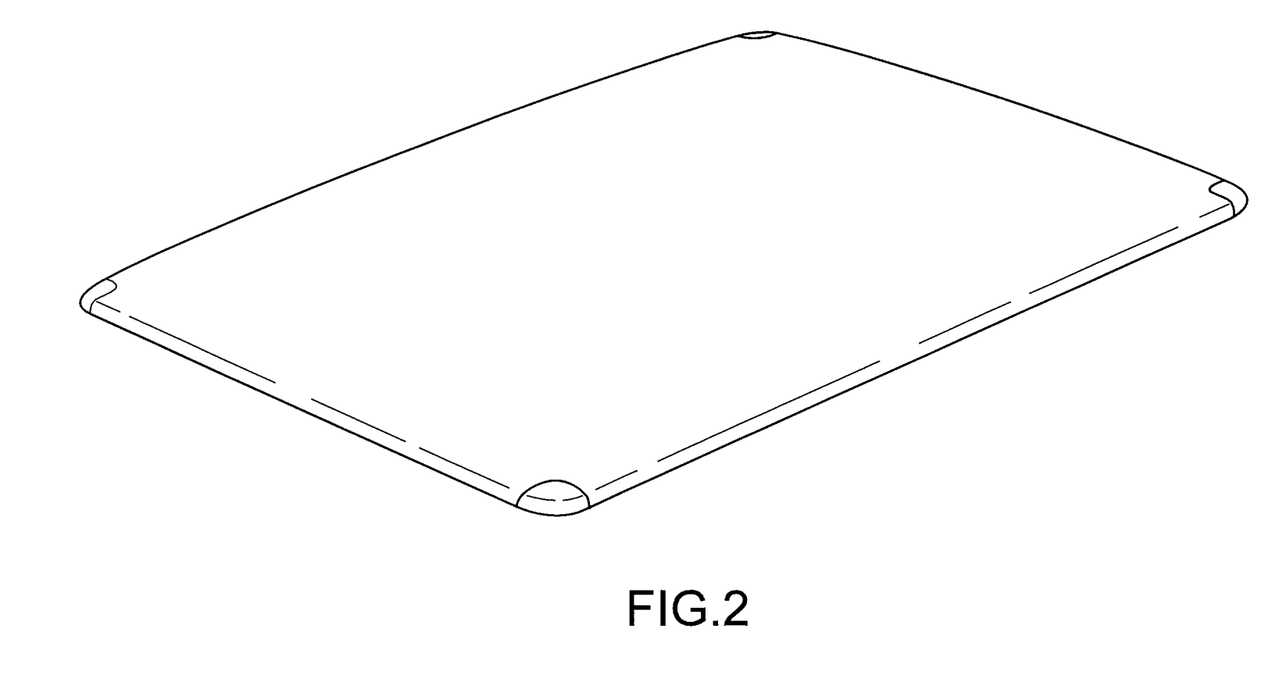
FIG. 2 depicts a perspective view of the back of the embodiment of FIG. 1.

FIG. 1 depicts a top perspective view of a sample embodiment 100, while FIG. 2 depicts a perspective view of the back of the embodiment. The embodiment 100 includes a frame 105 attached to a skin 110. As mentioned above, both the frame and skin may be formed from CFRP or another polymer material reinforced with substantially aligned fibers. A sample method for manufacturing the embodiment 100, as well as other possible embodiments, is discussed later with respect to FIG. 11.

In an embodiment having a cross-shaped skin 110, the corners of the frame 105 may be exposed. Accordingly, corner flanges 115 may be formed as part of the frame 105 or otherwise attached to the frame. These flanges generally form a contiguous surface with the skin and exposed portions of the frame when the embodiment 100 is formed. The exposed surface of each corner flange 115 is generally greater on the front than on the back, as can be seen by comparing FIG. 1 to FIG. 2. In other words, the skin 110 covers more of the back of each corner flange 115 than it does of the front. It should be noted that alternative embodiments may have more of the flange front covered than back, or have a skin covering both front and back equally. A strut or wall extends between each pair of corners.

Figure 3:
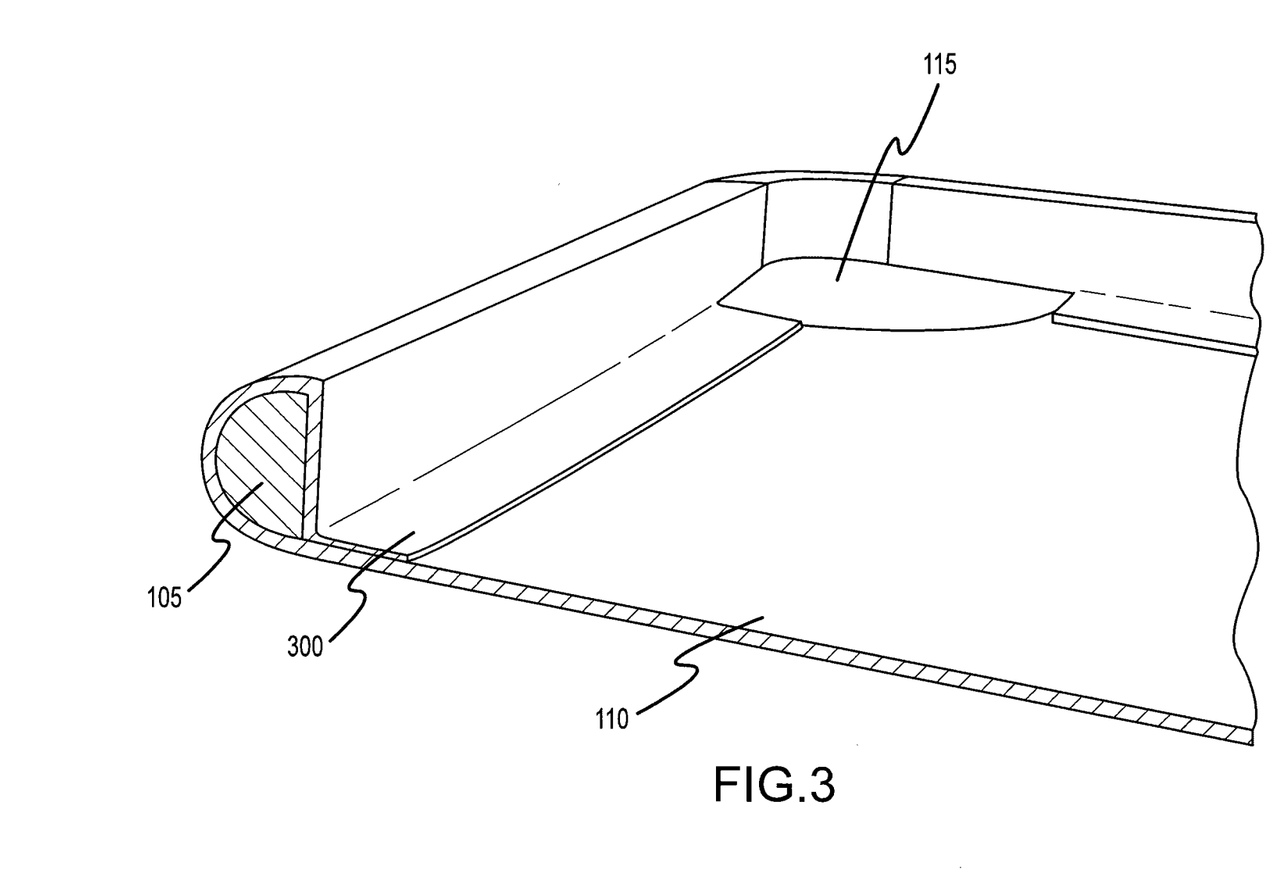
FIG. 3 is a cross-sectional view of a portion of the embodiment of FIG. 1, taken along line 3-3 of FIG. 1.
Figure 4:
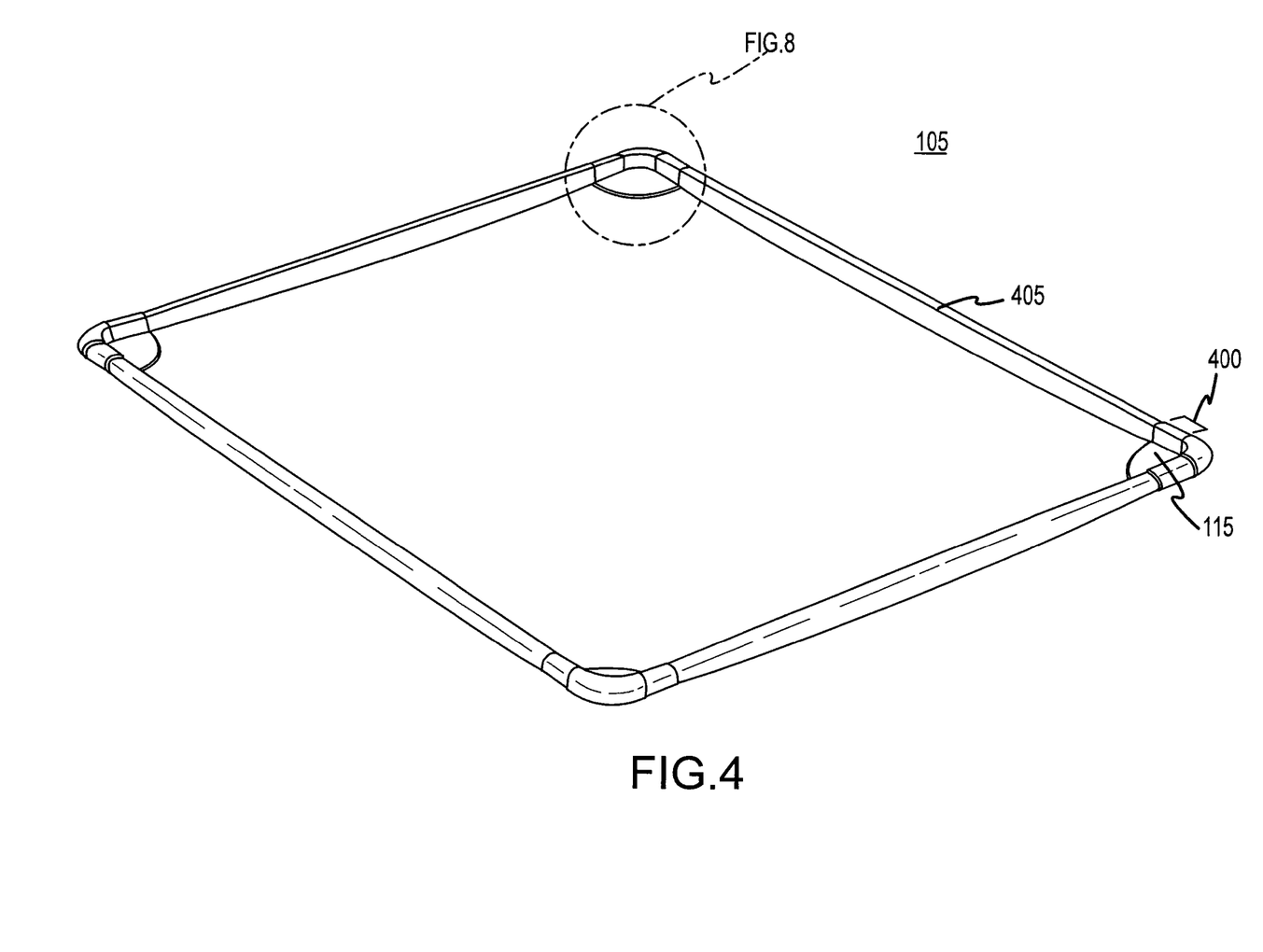
FIG. 4 depicts a top perspective view of a frame portion of the embodiment of FIG. 1.

As shown to best effect in FIGS. 1, 3 and 4, the frame 105 or spine is a rectangular member having a rounded outer edge forming an arc segment and a substantially flat inner edge. Thus, in cross-section as shown in FIG. 3, the frame 105 appears to be a portion of a circle. It should be noted that FIG. 3 is a cross-section of the embodiment 100 taken along line 2-2 of FIG. 1. The skin 110 surrounds the frame 105 and forms an inner lip 300 along the base of the embodiment near each sidewall. By adhering to itself and forming the inner lip 300, the skin 110 generally provides a strong bond and contributes to the overall adhesive bond between skin and frame.

Although the frame 105 is shown in cross-section in FIG. 2 as having a rounded outer edge and flat inner edge, the shape of the frame's surfaces may vary in alternative embodiments. For example, the frame may be C-shaped in cross section in certain embodiments, rectangular in others and so on. Practically speaking, the shape of the frame may vary depending on the application of the embodiment 100, space constraints, heat distribution factors, loading on the embodiment and so forth.

Figure 5:
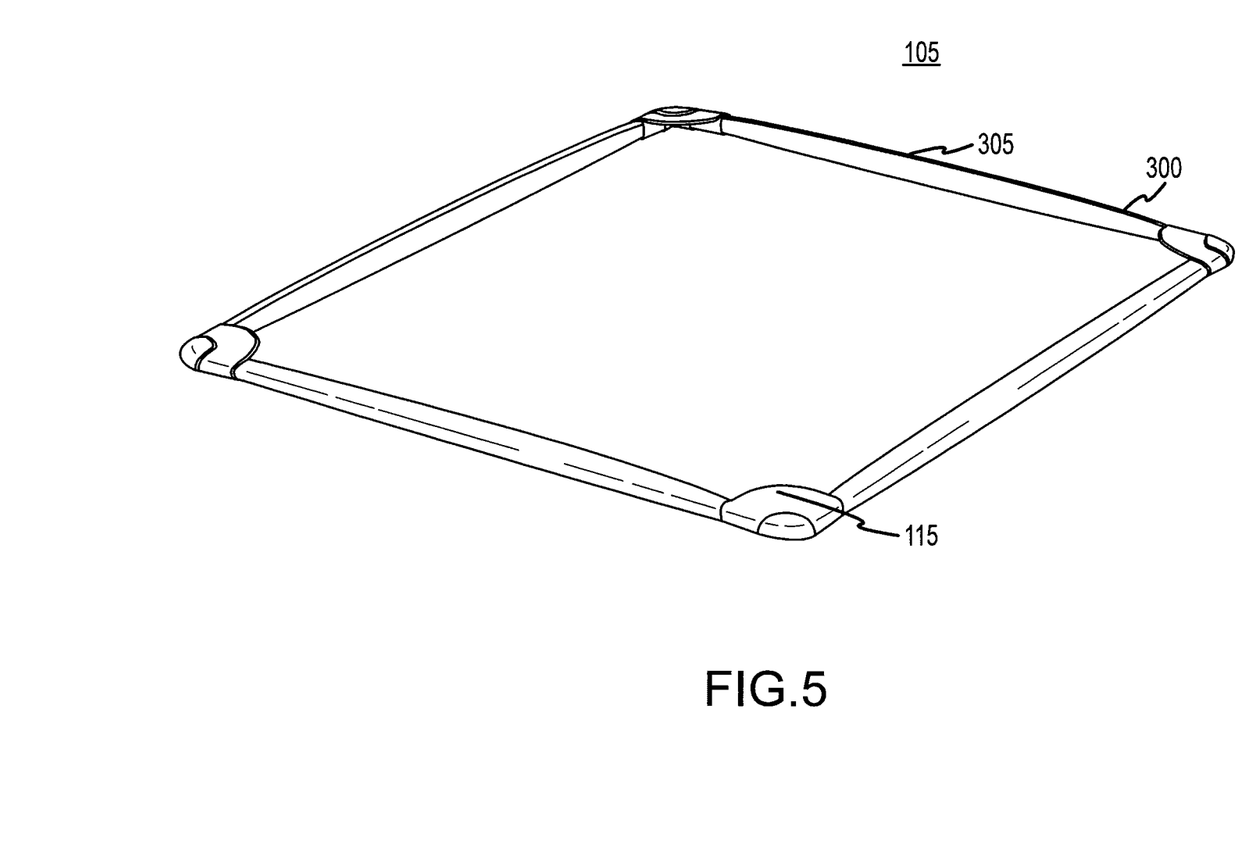
FIG. 5 depicts a back perspective view of the frame portion shown in FIG. 4.

FIGS. 4 and 5 generally depicts top and bottom perspective views of the frame 105. The frame 105 is made of a CFRP material, typically by mixing chopped carbon fibers with the same epoxy used to form the individual CFRP layers of the skin 110. Accordingly, the composition of the frame and skin are nearly identical in the present embodiment.

Other embodiments may be formed from a different fiber-in-matrix material. For example, the material may employ a reinforcing fiber such as a glass fiber, aramid (one example of which is KEVLAR), polyethylene (including DYNEEMA and SPECTRA), polypropylene and others. The material may use other matrix components, including any other type of thermosetting material, (examples of which are polyester, vinyl ester, phenolics, and son on), thermoplastics including nylon or another polyamide, polypropylene, high density polyethylene, Peek, and others. When a thermoplastic is used to construct the embodiment, the spine or frame could be injection molded using a carbon filled nylon, thereby permitting the skin 110 to be thermoformed from carbon fiber reinforced nylon pre-impregnated sheet. Further, un such an embodiment the frame 105 and skin 110 may be attached to one another using only heat; pressure may not be required. Accordingly, it should be understood that any of the foregoing materials may be employed singly or in combination instead of CFRP in embodiments. Thus, references herein to "CFRP" should be understood to be provided as one example of the foregoing materials and combinations only.

Figure 8:
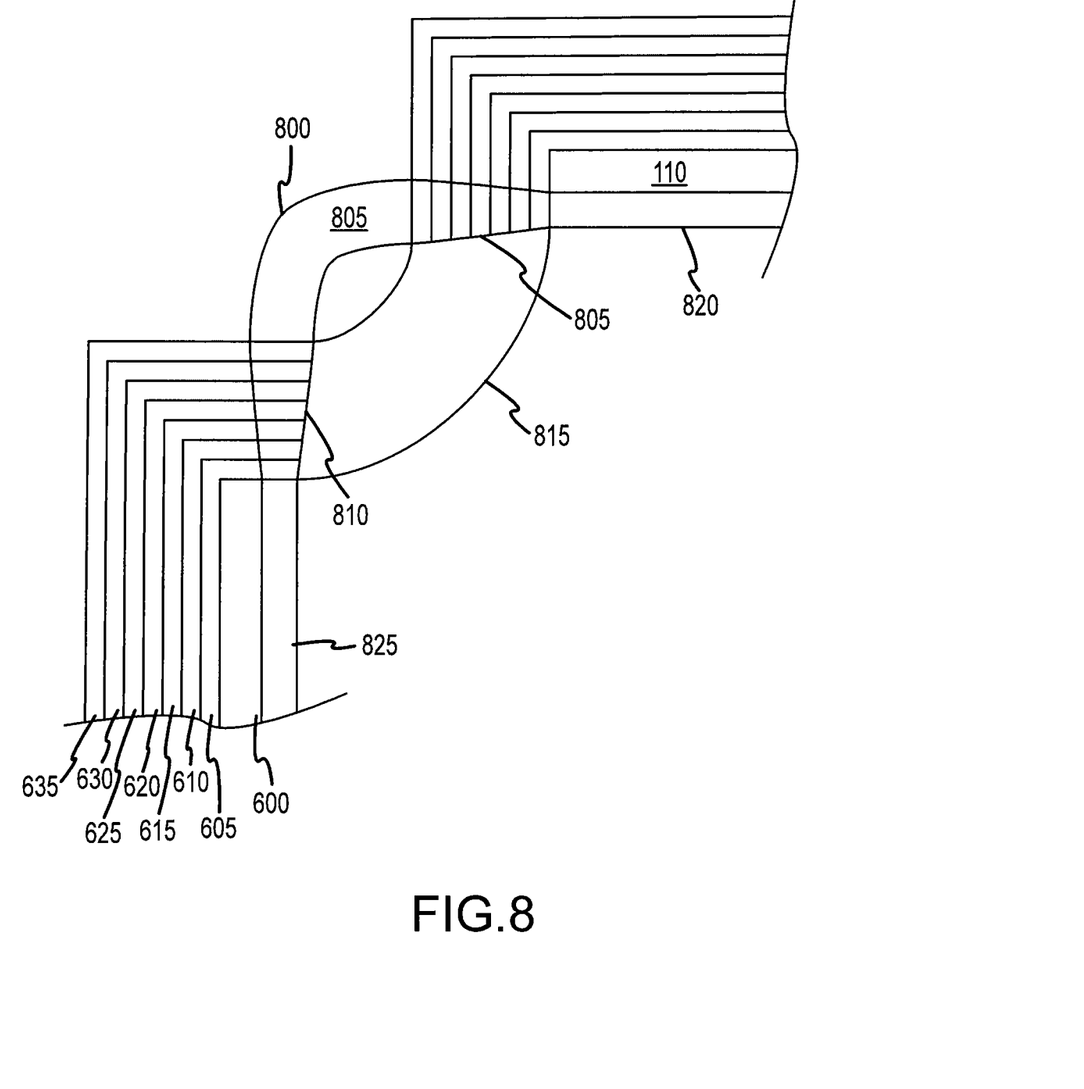
FIG. 8 is a top plan view of a corner portion of the embodiment of FIG. 1, shown during manufacture of the embodiment.

The frame 105 consists of multiple walls 405, each of which has a maximum height in the middle and tapers towards the corners of the frame. A taper segment 400 is defined on each wall at each corner. The taper segment 400 (also shown as elements 805 and 810 in FIG. 8) generally extends from the edge of the corner flange 115 to the beginning of the corner radius. FIG. 8 is a magnified view of the portion of the frame 105 shown in the dashed box of FIG. 4.

The corner flanges 115 provide reinforcement against stresses and shocks at each corner. By extending the flanges outward from the corner, stresses resulting from impacts on the corners may be distributed across a larger area, thereby reducing the likelihood that the frame will crack when the corner impacts a surface. Further, spreading such stresses along a larger surface (e.g., the flange) may reduce the impact or vibration transmitted to electronic components housed in the embodiment 100, thereby reducing the likelihood of device failure.

Figure 6:
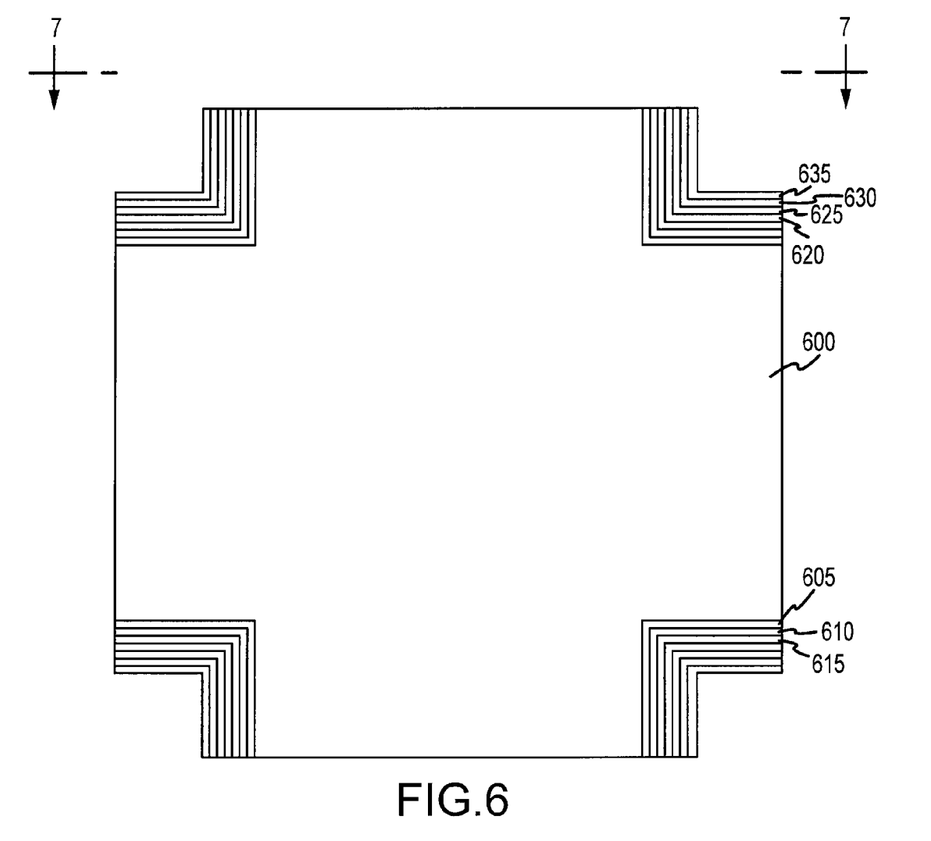
FIG. 6 is a top plan view of a skin portion of the embodiment of FIG. 1
Figure 7:
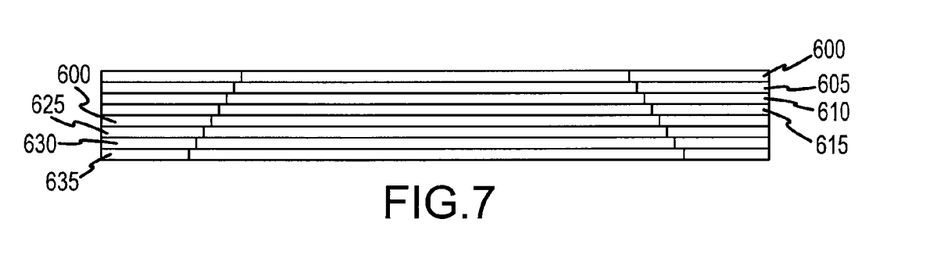
FIG. 7 is a cross-section view of the skin shown in FIG. 6, taken along line 7-7 of FIG. 6.

Turning to FIGS. 6 and 7, the skin 110 will now be discussed. As depicted in FIGS. 6 and 7, the skin 110 may be formed from a number of individual layers 600, 605, 610, 615, 620, 625, 630, 635 stacked atop or side by side one another. Although the skin 110 is shown as having eight layers, it should be appreciated that other embodiments may employ more or fewer layers.

Each layer 600, 605 . . . 635 is an individual sheet of CFRP. In the present embodiment, adjacent layers are oriented such that the fibers of adjacent layers do not extend in the same direction. For example, the fibers in layer 600 may extend from the top to the bottom of FIG. 6 while the fibers in layer 605 are offset at a 45 degree angle and the fibers in layer 610 run left to right with respect to FIG. 6. The exact offset between the fibers of adjacent layers may vary, although a 45 or 90 degree offset is often employed. The layers may be bonded to one another by any of a variety of manners, including chemical adhesives, heat sealing (thermoforming), ultrasonic adhesion, chemical reaction between layers, and so on. Typically, the impregnated layers forming the skin 110 are co-cured to affix adjacent layers.

As shown to best effect in FIG. 6, each layer 600, 605 . . . 635 is undercut at the corners with respect to the layer beneath it, such that the topmost layer has its edges cut with the deepest corners (e.g., corners closest to a centerline of the skin 110). Although the skin is shown with each layer having its corners undercut along both a horizontal and vertical axis, in alternative embodiments such undercuts may occur only along one of the two axes. In yet other embodiments, only certain corners may be undercut or not corners may be undercut. It should be noted that each layer is bonded to the adjacent layer(s) in order to resist the skin 110 separating into component elements.

FIG. 7 shows the various layers 600, 605 . . . 635 of the skin 110 from an end view, specifically along line 7-7 of FIG. 6. When viewed from this angle, it can be seen that the layers 600, 605 . . . 635 form a stair step pattern when taken as a whole. This undercut pattern generally interacts with the corner portions of the frame 105 to impart additional resistance against tearing, disconnecting, or peeling away of the skin 110 from the frame, as will now be discussed with reference to both FIG. 7 and FIG. 8.

Figure 9:
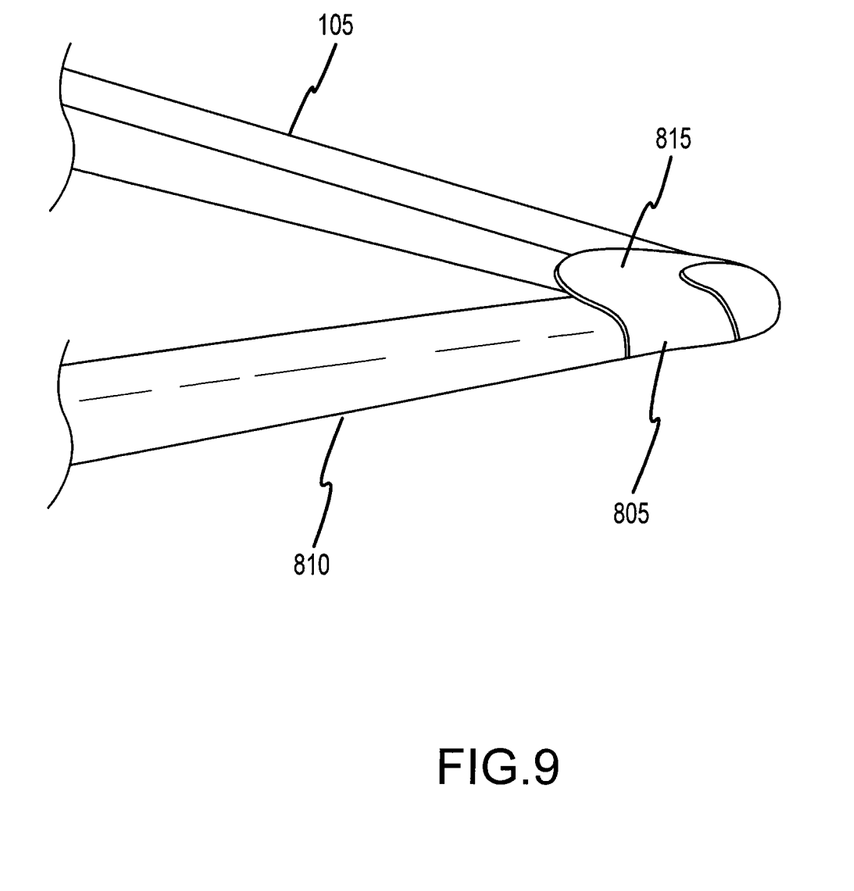
FIG. 9 is a perspective view of the bottom of a corner of the frame shown in FIG. 4.

FIG. 8 depicts a portion of the frame 105 during manufacture of the embodiment, specifically a corner 800 having a first tapered portion 805 and a second tapered portion 810. The tapered portions 805, 810 are joined to one another via the corner flange 815. In the view of FIG. 8, the skin 110 is not yet attached to the frame 105 although it is properly aligned for attachment. In this manner, the portions of the frame underlying the skin may be seen FIG. 9 is a perspective view of the bottom of the corner 800, showing the corner flange 815 as well.

The tapered sections 805, 810 generally narrow along the transition from the corner 800 to the straight, mandrel segments 820, 825 of the frame 105. The mandrel sections and tapered sections are both solid in cross-section, although alternative embodiments may be hollowed. Generally, the thickness of the tapered portion at the edge of the corner 800 is equal to the thickness of the mandrel segments plus the thickness of all layers of the skin 110 as it wraps circumferentially around the mandrel segment. That is, when the embodiment 100 is fully assembled, there is little or no noticeable variation in the thickness of any sidewall because the added dimension of the skin 110 compensates for the difference between the thicknesses of the corner 800, tapered sections 805, 810 and mandrel segments 820, 825. Further, the skin 110's individual layers 600, 605 . . . 635 form a stair-step pattern that generally compensates for the thinning/tapering of the tapered portions. When the skin is wrapped around the frame, a portion of the corner flange 815 is covered by the skin. Generally, the corner flange 815 extends between the two tapered sections 805, 810 of each corner.

Figure 10:
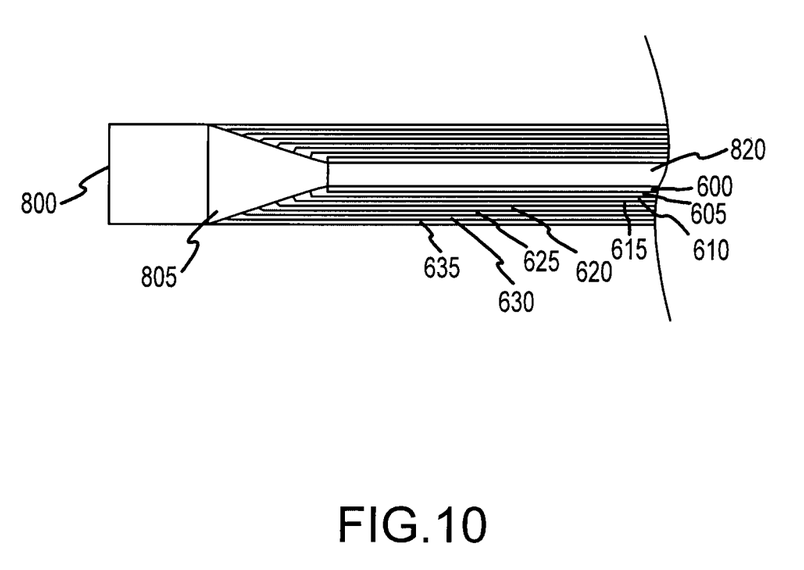
FIG. 10 is a cross-section view of the embodiment taken along line 10-10 of FIG. 1.

FIG. 10 shows, in cross-section, one example of the skin 110 wrapped around one length of the frame 105. In particular, FIG. 10 shows the relationship between the stair-step, undercut layers 600, 605 . . . 630 of the skin and the tapered section 810 and mandrel portion 825 of the frame. FIG. 10 is a cross-sectional view of the embodiment taken along line 10-10 of FIG. 1.

As can be seen in FIG. 10, the overall height of the embodiment 100 is substantially invariant, except with increasing thickness of the frame 105 as it extends towards the middle of each mandrel section 820, 825. The various layers 600, 605 . . . 630 of the skin 110 compensate for the decreased height/cross-section of the tapered segment 810 and the mandrel portion 825. As the tapered segment 810 decreases in dimension, additional layers add thickness and/or height to the overall shape of the embodiment. It should be noted that certain embodiments may step down the dimension(s) of the tapered segment 810 instead of providing it with a relatively smooth, conic sidewall. In such an embodiment, the length of each "step" or section of the tapered segment may be approximately the distance of a corresponding offset between adjacent layers of the skin 110. Thus, when the skin is wrapped around the frame during manufacturing (as described below with respect to FIG. 11 et. seq.), each layer lies adjacent a step formed about the circumference of the tapered section 810.

In addition to providing a uniform transition between a corner 800 and mandrel section 825, the stepped portions formed by the offset layers of the skin 110 also may serve to enhance bonding between the skin and frame 105. By gradually spreading out the transitions and edges of each layer 600, 605 . . . 630 across the tapered section 810, stresses placed on the embodiment 100 may be spread across the tapered section instead of concentrated at a joinder point between the skin and frame. Accordingly, the stair-step structure of the skin, combined with the tapered portions of the frame, may reduce the possibility of cracks forming or separation of the skin and frame due to mechanical and/or thermal stress.

It should be noted that other embodiments may reverse the position of the mandrel portion 825 and tapered portion 810, as well as forming the stair-step pattern in the skin 110 in the middle portion of the skin edges instead of at the corners.

Figure 11:
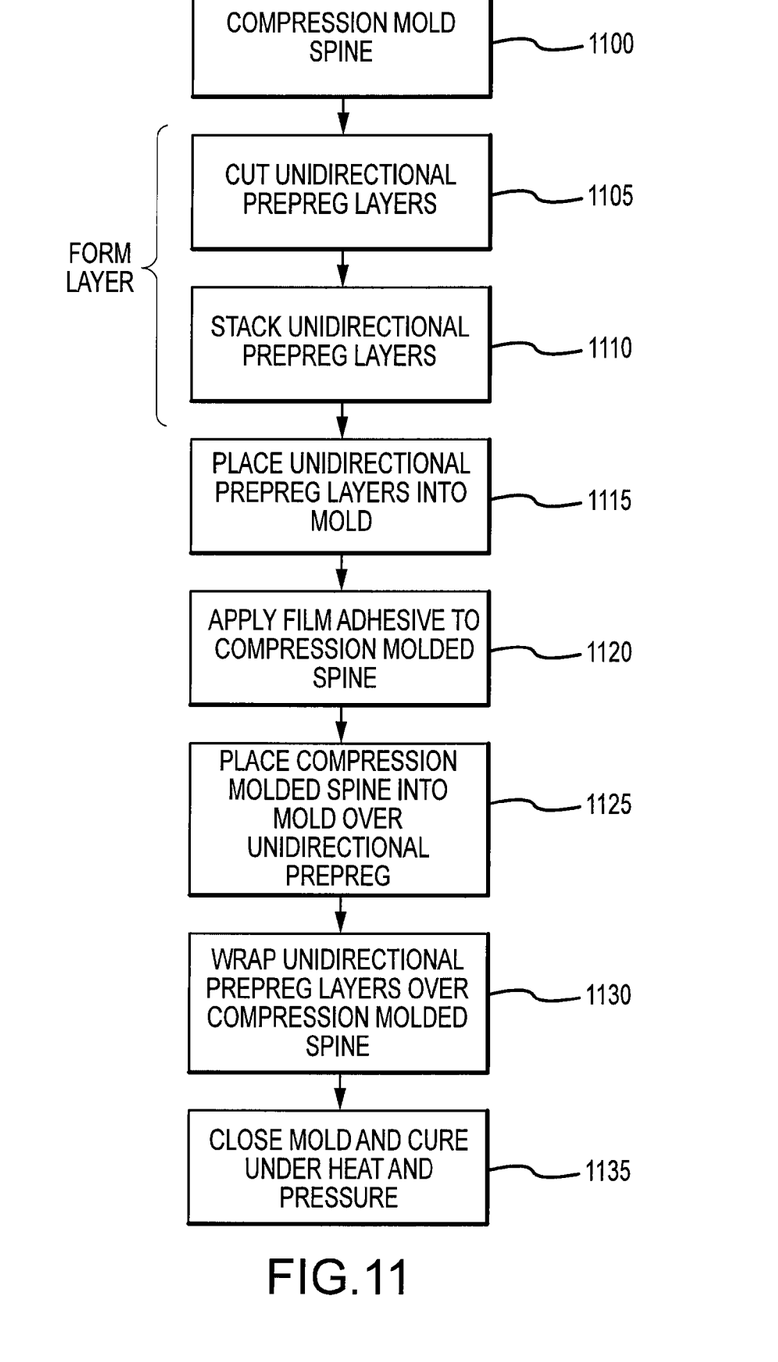
FIG. 11 is a flowchart setting forth a sample method for manufacturing the embodiment shown in FIG. 1.

FIG. 11 is a flowchart showing one sample method for forming an embodiment 100 or similar embodiments. It should be understood that certain operations may be performed in orders other than those shown here. For example, the skin 110 may be created prior to compression molding the frame 105. Accordingly, variations on the sample method will be readily apparent to those of ordinary skill in the art. Such variations are contemplated and embraced by this document. Further, the order of the operations shown here is for convenience only and should not be interpreted as necessitating any particular order for manufacture.

In operation 1100, the frame 105 is compression molded. Typically, the frame is formed in a two or three piece mold. A mixture, typically a powder, granular blend or heterogeneous combination of an epoxy and chopped carbon fiber, is placed in a mold base. It should be noted that this epoxy/carbon fiber mixture is similar to, if not identical to, the composition of the skin 110. The same or a similar epoxy is used in both elements and each has carbon fibers suspended therein. A top plate of the mold is lowered into the mold base and distributes the powder to a void space formed by the top plate and mold base. Generally, this void space takes the shape of the finished frame 105.

The mold is heated while the powder is compressed by the mold. As the mixture heats, the epoxy melts and flows to fill the void space, thereby distributing the chopped carbon fibers throughout the space. As the epoxy cools, it hardens into a matrix around the carbon fibers. When the epoxy sets, the frame 105 is formed and may be removed from the mold (or may remain in place in the event the same mold is used in operations 1120 through 1135).

In operation 1105, each of the layers 600, 605 . . . 630 of the skin 110 is cut. In particular, the stair-step configuration created by the layers in combination is cut into each layer. In operation 1110, the layers are laid atop each other and bonded to one another. Such bonding may occur only at the middle of the various layers, leaving non-stick release paper covering the stair-step configuration. It should be noted that certain embodiments may bond the layers to form the skin 110 and then cut away portions of the individual layers to form the aforementioned stair-step configuration.

In operation 1115, the skin 110 is placed into the mold used to create the final form of the embodiment. That is, the mold affixes the skin 110 to the frame 105. In operation 1120, an adhesive (typically a film adhesive) is applied to the exterior of the frame 105 after the non-stick release paper is removed, and/or to those portions of the skin 110 that will contact the frame during the molding operation. Once the adhesive is applied, the frame may be placed into the mold over the skin in operation 1125. In the event the skin and frame are to be bonded to one another by thermal welding, ultrasonic welding or the like, the adhesive may be omitted and operation 1120 skipped.

With both pieces placed in the mold, the edges of the skin 110 may be wrapped around or over the frame 105. Generally, this is done in such a manner as to align the stair-step portions of the skin with the tapered segments of the frame. When the pieces are properly aligned, the mold may be closed and a draft applied to the skin and frame. The draft generally keeps these pieces in position as the mold is closed, heated and pressurized, as well as permitting the mold to generate both horizontal and vertical pressure as it closes. Under sufficient heat and pressure, the exact amounts of which may vary with the composition of the CFRP, dimensions of the skin and/or frame, and so forth, the skin and frame are cured and adhered to one another. It should be noted that the determination of the proper heat and/or pressure is within the purview of one of ordinary skill in the art. Typically, the skin 110 wraps around the outside of the frame 105, extends along the frame's inner edge and overlies a portion of itself when the mold is closed. This overlying of the skin on itself forms the inner lip 300 shown to best effect in FIG. 3, and facilitates the creation of a strong bond surrounding the frame and locking it in place with respect to the skin.

Because the skin 110 and frame 105 are made from similar, if not identical, compositions, the pieces bond to one another relatively efficiently and strongly. Essentially, the embodiment 100 becomes a unitary or near-unitary structure due to the likeness of the materials constituting the frame and spine. Further, because the skin and frame are made from similar or identical materials, the coefficient of thermal expansion of both elements matches or nearly matches. Accordingly, thermal loads create only minimal stresses at the interfaces between the skin and frame, and thus cracking or separation of the frame and/or skin may be reduced.

After curing, the embodiment 100 may be removed from the mold.

Embodiments may house any number of electronic components. For example, certain embodiments may be used to form the exterior surface of a mobile telephone, a laptop or notebook computer, a tablet computing device, a desktop computer, a television, a stereo receiver, or practically any other electronic device. The embodiment may form substantially the entirety of an electronic housing or only a portion, such as the back casing and sidewalls. Alternate embodiments may not be electronics housings at all, but instead may form any number of objects typically made from metals or plastics. For example, certain embodiments may be formed as described herein to create serving utensils or dishes. Others may create boxes or storage containers.

It should be noted that a variety of objects may be formed in accordance with the methods and embodiments described herein. For example, a fiber-in-matrix frame and fiber-in-matrix skin may be used to construct the head of a golf club. A three-dimensional frame in the shape of the club head may be formed and the skin wrapped around and attached to the frame as described above. A single skin may be used or multiple skins may form the exterior of the club head (for example, one skin for each side of the head). Likewise, more than one frame may be employed in certain embodiments. Continuing the example of the golf club head, two frame—one upper and one lower—may be formed and then attached to one another prior to applying the skin(s). Alternative embodiments may take the form of: turbine blades (for example, for a windmill or turbine); propellers; aircraft wings, fins or tail structures; bicycle parts such as crank arms and seat posts; shipping containers; skis and snowboards; and so on.

It should be noted that complex, enclosed three-dimensional shapes may be created using the embodiments disclosed herein; there is no requirement that any portion of the created shape be open or exposed. Thus, the frame be shaped such that one segment of a frame extends along an X-axis of an object to be formed, a second segment along the object's Y-axis and a third segment along the object's Z-axis. For example, a square box may have a frame extending along three separate axes from each corner of the box. In other embodiments, the frame segments may define three or more unique planes extending between each set of two segments, thus defining a three-dimensional structure or part of a structure.

The foregoing has been generally described with respect to particular embodiments and methods of manufacture. It will be apparent to those of ordinary skill in the art that certain modifications may be made without departing from the spirit or scope of this disclosure. For example, a fiber other than carbon may be used as a strengthening or stiffening element. As one example, certain metals may be used instead, or another type of plastic may be used. Accordingly, the proper scope of this disclosure is set forth in the following claims.

I claim:

1. A housing, comprising:
   a frame formed from a first material and defining:
      a corner segment;
      a main segment; and
      a tapered segment connecting the corner segment to the main segment; and
   a cross-shaped skin formed from the first material separately from the frame and bonded to the frame;
   wherein:
      the cross-shaped skin is formed from stacked layers of the first material, the stacked layers positioned to at least partially overlay the tapered segment;
      an outer edge of each of the stacked layers form at least one stair-step pattern along a first direction and a second direction;
      a portion of the cross-shaped skin covers the main segment of the frame; and
      each layer of the stacked layers has a smaller surface area than the layer below.

2. The housing of claim 1, wherein the first material is a composite of at least fiber and a matrix suspending the fiber.

3. The housing of claim 2, wherein the first material is a carbon fiber reinforced plastic.

4. The housing of claim 1, wherein:
   the frame is solid in cross-section; and
   at least a part of each layer of the stacked layers lies adjacent a unique portion of the tapered segment.

5. The housing of claim 1, wherein at least a portion of the stair-step pattern encircles at least a portion of the tapered segment.

6. The housing of claim 1, wherein the main segment is straight.

* * * * *